(12) United States Patent
Liu

(10) Patent No.: US 11,486,030 B2
(45) Date of Patent: Nov. 1, 2022

(54) PROCESS AND APPARATUS FOR CONTINUOUS PRODUCTION OF POROUS STRUCTURES

(71) Applicant: Molecule Works Inc., Richland, WA (US)

(72) Inventor: Wei Liu, Richland, WA (US)

(73) Assignee: Molecule Works Inc., Richland, WA (US)

(*) Notice: Subject to any disclaimer, the term of this patent is extended or adjusted under 35 U.S.C. 154(b) by 552 days.

(21) Appl. No.: 16/235,178

(22) Filed: Dec. 28, 2018

(65) Prior Publication Data
US 2019/0358706 A1    Nov. 28, 2019

Related U.S. Application Data

(60) Provisional application No. 62/675,341, filed on May 23, 2018.

(51) Int. Cl.
| | |
|---|---|
| *C23C 8/06* | (2006.01) |
| *B22F 3/10* | (2006.01) |
| *C23C 8/60* | (2006.01) |
| *C23C 16/30* | (2006.01) |
| *C23C 16/28* | (2006.01) |
| *C23C 8/02* | (2006.01) |
| *B22F 3/11* | (2006.01) |

(52) U.S. Cl.
CPC .............. *C23C 8/06* (2013.01); *B22F 3/1039* (2013.01); *C23C 8/02* (2013.01); *C23C 8/60* (2013.01); *C23C 16/28* (2013.01); *C23C 16/30* (2013.01); *B22F 3/1143* (2013.01); *B22F 2201/013* (2013.01)

(58) Field of Classification Search
None
See application file for complete search history.

(56) References Cited

U.S. PATENT DOCUMENTS 3,352,769 A    11/1967  Ruben
3,668,024 A *  6/1972  Johnson ............... B22F 1/0085
                                                        419/31
(Continued)

FOREIGN PATENT DOCUMENTS

| CN | 203569154 U | | 4/2014 |
| CN | 104004888 A | * | 8/2014 |
| EP | 0 311 030 A1 | | 4/1989 |

OTHER PUBLICATIONS

Machine translation of CN-104004888-A, retrieved Jul. 6, 2021.*

*Primary Examiner* — David P Turocy
(74) *Attorney, Agent, or Firm* — The Marbury Law Group, PLLC

(57) ABSTRACT

An apparatus and process are presented for continuous production of metal-based micro-porous structures of pore sizes from 0.3 nm to 5.0 μm from a green part of characteristic diffusion mass transfer dimension less than 1 mm through chemical reactions in a continuous flow of gas substantially free of oxygen. The produced micro-porous structures include i) thin porous metal sheets of thickness less than 200 μm and pore sizes in the range of 0.1 to 5.0 μm, ii) porous ceramic coating of thickness less than 40 μm and ceramic particle sizes of 200 nm or less on a porous metal-based support structures of pore sizes in the range of 0.1 to 5 μm.

19 Claims, 11 Drawing Sheets

(56) References Cited

U.S. PATENT DOCUMENTS

| | | | |
|---|---|---|---|
| 3,677,721 A * | 7/1972 | Elbert et al. | H01M 4/80 138/145 |
| 3,871,829 A * | 3/1975 | Keith | C01G 43/01 422/204 |
| 5,693,288 A | 12/1997 | Nakamura | |
| 5,738,907 A | 4/1998 | Vaccaro et al. | |
| 5,850,591 A | 12/1998 | Sugikawa | |
| 2007/0128568 A1 * | 6/2007 | Tenzek | F27B 9/20 432/121 |

\* cited by examiner

PROCESS AND APPARATUS FOR CONTINUOUS PRODUCTION OF POROUS STRUCTURES

CROSS REFERENCE TO RELATED PATENT APPLICATION

This application claims the benefit of U.S. Provisional Application No. 62/675,341, filed May 23, 2018, hereby incorporated herein by reference in its entirety.

STATEMENT REGARDING RIGHTS TO INVENTION MADE UNDER FEDERALLY-SPONSORED RESEARCH AND DEVELOPMENT

This invention was made with Government support under contract number DE-AR0000650 awarded by the DOE, Office of ARPA-E. The Government has certain rights in this invention.

FIELD

The present invention is directed to devices and methods for producing porous structures.

BACKGROUND

Micro-porous structures have a variety of applications, including molecular separation, particulate filtration, adsorption and absorption, catalytic reaction, conductive electrodes, membrane separator, acoustic absorption, impact and high-energy absorption, sensors, actuators, and hybrid composite materials. Metal-based structures provide some unique performance attributes compared to other materials. For example, metals possess much higher electrical and thermal conductivity than ceramics and polymers; metals are ductile compared to fragile ceramics; metals provide higher mechanical strength and thermal stability than polymers. Many commercial products with metal-based structures having pore sizes above about 10 micrometers are produced, such as screens and meshes, foams and sponges, and sintered filters. However, metal-based structures with pore sizes smaller than 10 um are expensive to make at large industrial scales.

The specific surface area of a porous structure increases with decreasing pore size in inverse first order. A high specific surface area is desired by applications for which large surface area is desirable, such as adsorption, catalytic reaction, and porous electrodes. The porous structures of pore sizes at micro- and sub-micrometer level can be used to filter fine particulates that are difficult to separate by other methods, such as filtering of bacteria, virus, and soot in fossil fuel combustion exhaust. The porous metal structures of pores at sub and micrometer scale can also be used as a support to prepare high-flux thin membranes of much smaller pore sizes, such as molecular sieve membranes of pores from 0.3 to 2.0 nm. The metal-based porous structures can be produced by powder metallurgy technologies at industrial scales from fine metallic particles. The metal particles, with addition of some binders and/or pore formers, can be made into various desired shapes (plate, tube, capillary, monolith) and sintered to form porous structures. The resulting pore size generally decrease with decreasing size of the metallic particle used. However, fine metallic particles are expensive to purchase and can become explosive when the particles become too small. Thus, using fine metal particles to produce porous structures is an expensive process.

SUMMARY

Embodiments herein disclose a continuous reactive process for production of porous metal-based structures of pore sizes ranging from 0.3 nm to about 5 µm from a green part having a characteristic pore diffusion mass transfer dimension less than 1 mm. The process comprises i) continuously feeding the green part and gas flow into a reactor of high aspect ratio, such as environment-controlled tunnel furnace; ii) moving the green part through the reactor which is heated with a designated temperature profile long the length, where the green part is reacted and converted into a product part of the designated porous structures under continuous gas flow; and iii) cooling down the product part and moving it out of the furnace. In the reactive conversion process, mass transfer plays a role in formation of the designated porous structure.

The characteristic diffusion mass transfer dimension is the dimension of a green part that is desirable for formation of the designated porous structures, where gaseous reactants and/or products transport into or out of the green part through diffusion. For example, for a green part in a sheet form, the characteristic dimension is the sheet thickness. For a green part in a tubular for, the characteristic dimension is the wall thickness. For a green part in a monolith form, the characteristic dimension is the channel wall thickness. If the green part is a coating on the preformed porous support, the characteristic dimension is the coating layer thickness.

For well-defined pore shapes such as a cylindrical pore, the pore size is its diameter. However, there are different ways to characterize the size of the pore of irregular shapes. One quick assessment commonly used in the field is to use the width for nearly square-shaped pores, the diameter for nearly rounded pores, and the spacing between two narrow sides in slit or rectangle kind of pores. Hydraulic diameter, as defined in fluid mechanics, can be calculated for any shape of pores and used as the pore size. Microscopy analysis provides direct observation and assessment of the pore size and shape. Mercury porosimetry is a well-established experimental method to quantify exterior pore size of a porous structure over a range of about 0.1 to 100 µm. For pore sizes in the range of 0.3 nm to 100 nm, gas adsorption and desorption is an established method to quantify the pore size.

BRIEF DESCRIPTION OF THE DRAWINGS

FIGS. 6A and 6B are diagrams illustrating the preparation of additional porous structures on a precursor or promoting material deposited on a porous support structure, wherein FIG. 6A illustrates precursor or functional material supported on a porous structure as a film according to an embodiment and FIG. 6B illustrates precursor or functional material deposited inside pores of a support structure according to an embodiment.

FIG. 9A illustrates the green tape, FIG. 9B illustrates a metal sheet produced on the support plate and FIG. 9C illustrates a self-supported thin metal sheet.

FIG. 13D illustrates an elemental mapping of the coating.

FIG. 14B illustrates an elemental mapping of the coating.

DETAILED DESCRIPTION

The following description includes the preferred best mode of one embodiment of the present invention. It will be clear from this description of the invention that the invention is not limited to these illustrated embodiments but that the invention also includes a variety of modifications and embodiments thereto. Therefore, the present description should be illustrative and not limiting. While the invention is susceptible of various modifications and alternative constructions, it should be understood, that there is no intention to limit the invention to the specific form disclosed, but, on the contrary, the invention is to cover all modifications, alternative constructions, and equivalents falling within the spirit and scope of the invention as defined in the claims.

FIGS. 1-6 show three embodiments of the present invention. In the conversion process illustrated in FIG. 1, a green part body 100 comprising particles of metal precursors such as metal oxides, pore formers and organic additives is converted into a porous metallic structure 102 in hydrogen gas environment through the following reactions:

Organic additives+$H_2$→vapor

Pore former+$H_2$→vapor

Metal precursor(oxide)+$H_2$→Metallic grain(solid)+ vapor

Metallic grains(solid)→Networked porous structures

TABLE 1

Typical composition of green tapes

| | Wet slurry tape, Wt. % | Tape dried, Vol. % |
|---|---|---|
| Metal oxide | 52 | 33 |
| Pore former | 14 | 33 |
| Solvent | 25 | 0 |
| Dispersant | 1 | 4 |
| Binder | 5 | 18 |
| Plasticizer | 3 | 12 |

Figure 1:
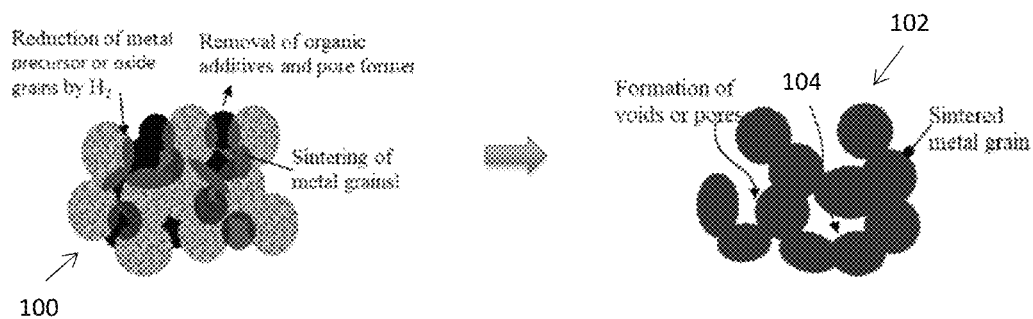
FIG. 1 is a drawing illustrating the conversion of a green part of metal oxide particles to a micro-porous metallic structure according to an embodiment.
Figure 2:
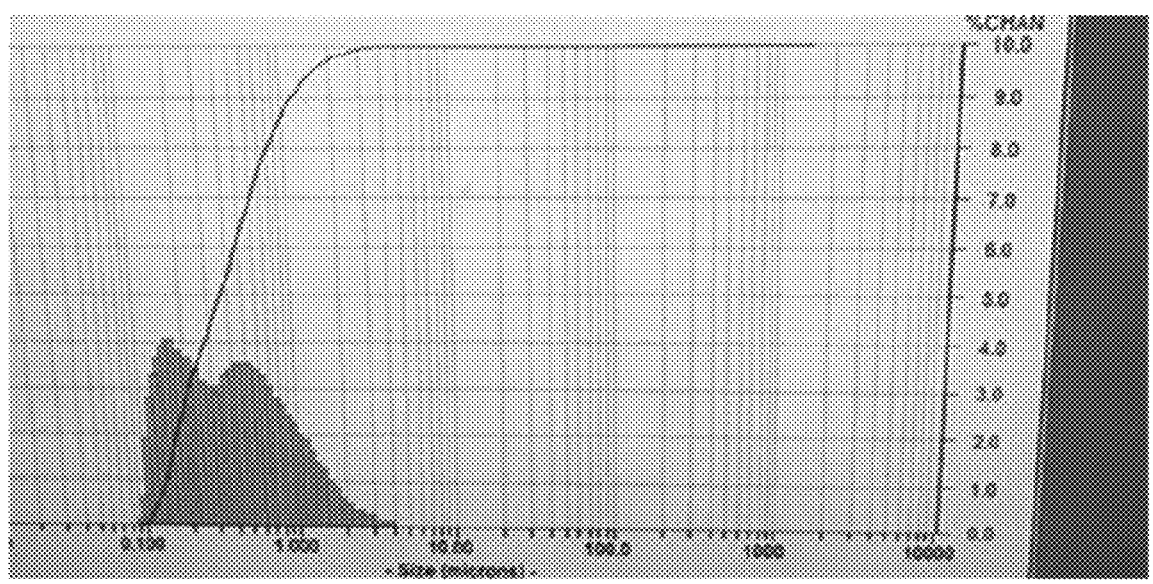
FIG. 2 is a plot of particle size distribution of nickel oxide used to make a green tape according to an embodiment.
Figure 18:
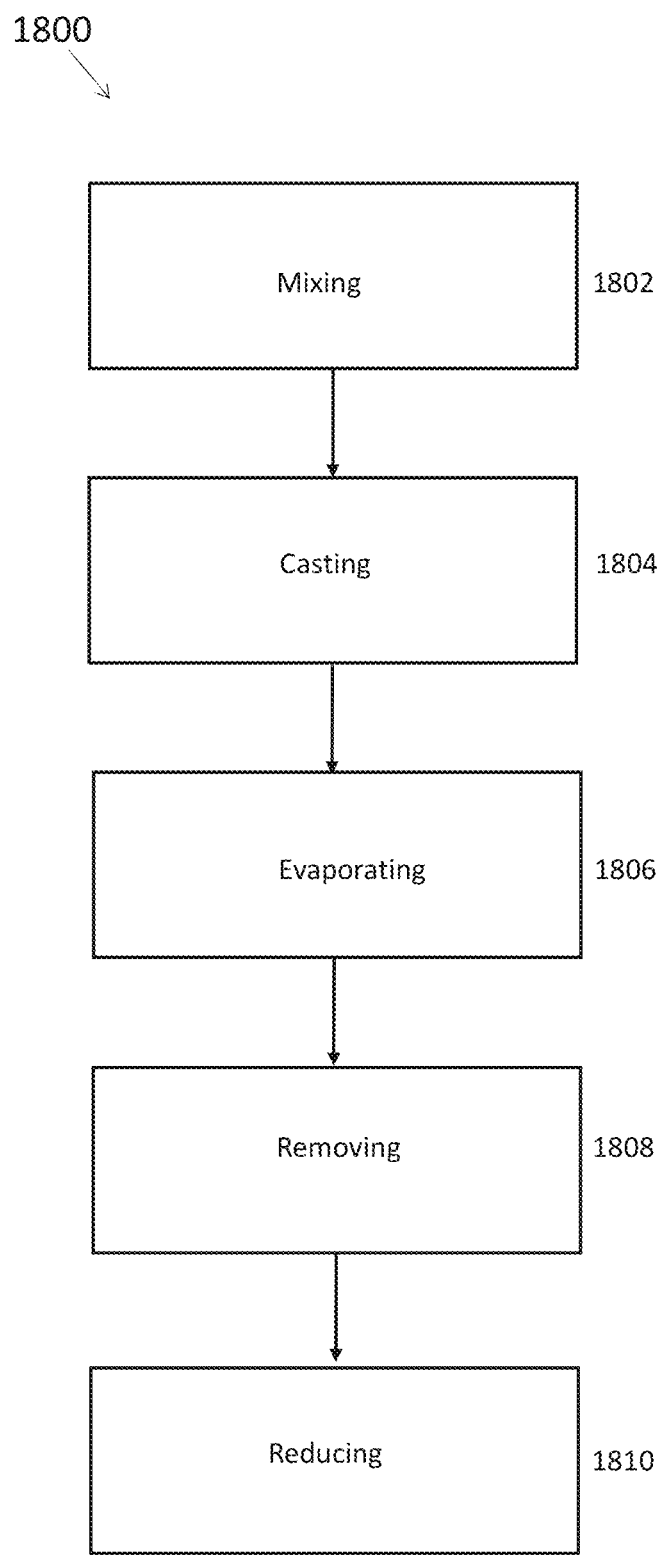
FIG. 18 is a flow diagram of a method of making porous structures according to an embodiment.

Compositions of the green part are illustrated with the green tape cast from slurry comprising metal oxide particles in table 1. Particle size distribution of the metal oxide such as nickel oxide used to make the slurry is shown in FIG. 2. The particle size may be in a range of 0.1 to 4 μm with 50% of the particles below 0.35 μm and 95% particles below 1.54 μm. FIG. 18 illustrates a flow diagram of an embodiment of a method 1800 of making porous structures from a slurry. In a first step, 1802, the metal oxide particles are mixed with a carbon black pore former, dispersant, organic binder, solvent and plasticizer into homogenous slurry in an organic solvent. Next, the slurry is cast into a green tape of about 70 μm thickness, step 1804. Then, the solvent is evaporated during casting to form a nearly dense green tape, step 1806. In the next step (step 1808), the non-volatile organic additives and pore formers are removed from the green part into vapor phase by pyrolysis, cracking, and/or hydrogenation reactions. Removal of these constituents in the green part leaves voids or pores 104 in the part. The metal precursor such as metal oxide is reduced into metallic grains. The gaseous species released from those reactions are swept away by a gas flow. Networked porous structures are formed by controlling the degree of sintering of these metallic grains (step 1810).

The pore size is mainly determined by particle size of the metal precursors. By using fragile precursor materials such as metal oxides, the particle size over a range of 100 nm to 5 μm can be produced by milling of bulk powder materials. Metallic materials are too ductile to be milled into such small sizes. The pore size in the resulting porous metal structure made from the fragile precursor materials can be smaller than the precursor particle size due to shrinkage of the metal precursor particle. For example, the density of nickel oxide is 6.67 g/cc, while the density of nickel metal is 8.89 g/cc. The porosity is mainly determined by volume fraction of the pore former in the green part. The pore former, as a sacrificial material, is preferably in-expensive and removable under the reaction conditions. The preferred pore former materials are carbon blacks, polymer particles, and carbonate particles. The organic additives, including dispersant, binder, and plasticizer, are used to make the metal precursor particle into desired shapes. They are typically organic materials.

Figure 3:
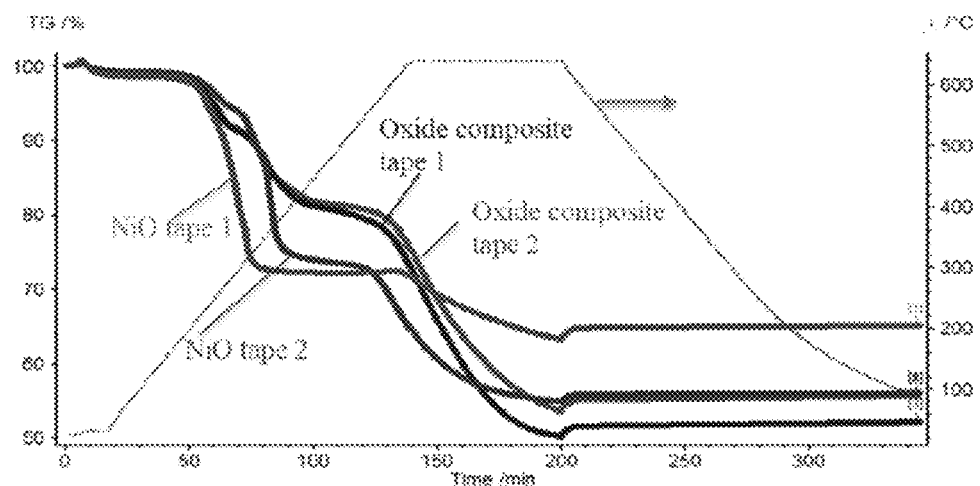
FIG. 3 is a plot of the reactivity of green tapes by TGA in $H_2$/Ar gas according to an embodiment.

Reactivity of the green part 100 can be characterized by thermogravimetric analysis (TGA). Weight changes of four different metal oxide green tapes processed by programmed heating in hydrogen/argon gas flow are shown in FIG. 3. The NiO tape 1 was made of nickel oxide particle and carbon black pore former, while the NiO tape 2 was made of the same nickel oxide but with a carbonate pore former. The oxide composite tapes were made of Ni—Fe—Cr mixed oxides and the carbon black pore former. The composite tapes 1 and 2 are made of mixed oxides of the same composition but prepared in two different ways. The sample was heated from ambient 25° C. to 650° C. at a ramp rate of 5° C./min and held isothermally at 650° C. for 2 hours. The weight loss started at about 220-240° C. First stage of rapid weight loss occurred between 320-400° C., which corresponds to pyrolysis of the organic additives and reduction of metal oxides. Second stage weight loss started at about 500-600° C., which corresponds to decarbonation. The green parts 100 of different compositions show some variation in the extent of weight loss and starting temperature. But, the green parts 100 exhibit common characteristics in removal of some constituents in the green part into vapor phase by chemical reactions.

Figure 4:
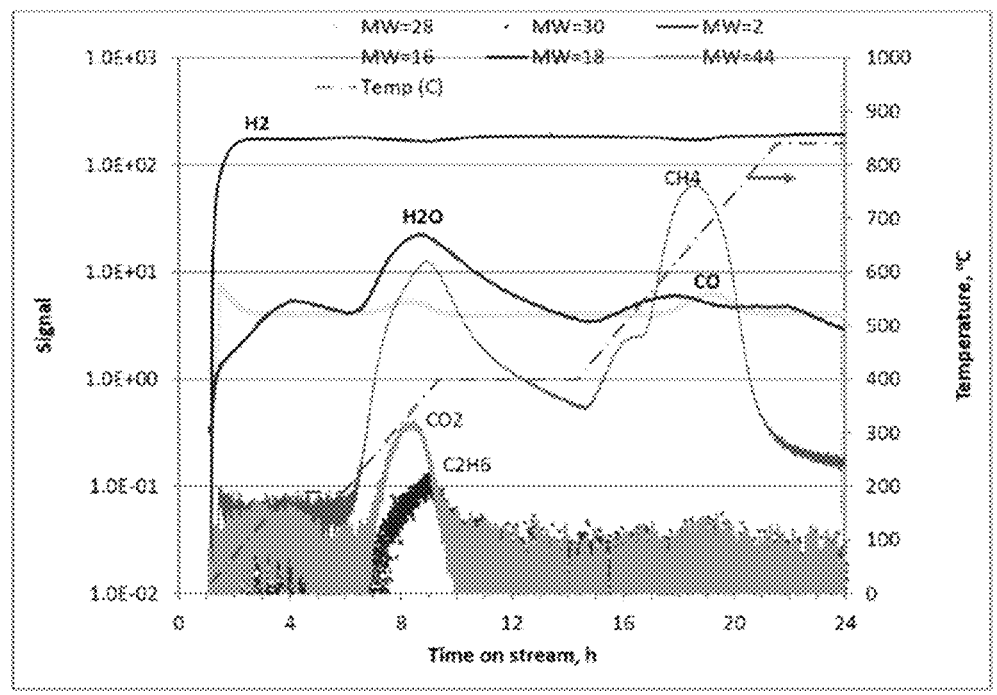
FIG. 4 is a plot illustrating evolution of gaseous molecules during reaction of nickel oxide green tape in hydrogen according to an embodiment.

The reactivity of the green part 100 can be further delineated by heating the sample inside a furnace with pure hydrogen gas flow. FIG. 4 shows evolution of gaseous reaction products, $H_2O$, $CO_2$, $C_2H_6$, $CH_4$, and CO during programmed heating of a nickel oxide green tape in pure hydrogen gas from 20 to 835° C. Peak production of $H_2O$, $CO_2$, $CH_4$ and $C_2H_6$ occurs in the temperature range of 200 to 400° C., which corresponds to a slight dip in hydrogen signal. $H_2O$ production is attributed to reduction of nickel oxide. Production of $CH_4$ and $C_2H_6$ results from pyrolysis and cracking of the organic additives. $CO_2$ formation can be explained by reaction of the organic additive with nickel oxide. The second peak production of $CH_4$ occurs in the range of 550 to 700° C., which results from reaction of hydrogen with the carbon pore former. Small amounts of CO were also produced during the process. Evolution of these gaseous products clearly shows the kinds of chemical reactions involved in decarbonization and deoxygenation of the green part for formation of sintered porous metallic structures.

Figure 5:
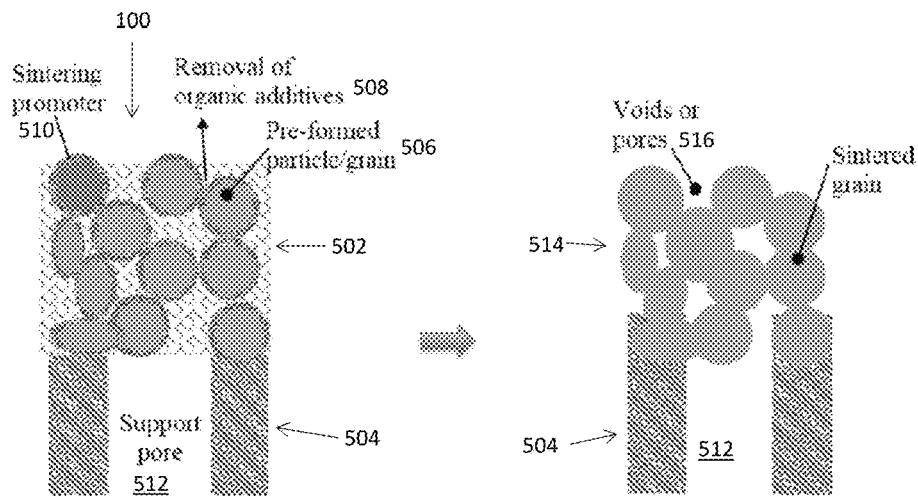
FIG. 5 is a drawing illustrating a green part of a supported coating to a micro-porous membrane or film according to an embodiment.

In the reactive conversion process illustrated in FIG. 5, the green part 100 is in the form of coating or film 502 supported on a pre-formed porous support structure 504. The coating layer 502 comprises packing of preformed particles/grains 506 with organic additives 508 and/or sintering promoters 510 at a thickness less than 40 μm. The support pore size is about 200 nm to 5 μm. Examples of the preformed particles 506 include stable ceramic crystalline materials, such as zirconia, alumina, ceria, and silicon carbide. These preformed particles 506 may be impregnated or doped with some promoter 510 to facilitate sintering of the preformed particle 506 from point-to-point contact to neck-to-neck bonding. Organic additives 508 such as dispersants and binders are incorporated into the green part 100 in the coating process. The preformed particle size is substantially smaller than the size of the support pores 512, by a few times to one order of magnitude, to form a membrane layer 514 having membrane pores 516 with pore sizes in the range of 5 to 100 nm. In an embodiment, the coating layer 502 may be formed by multiple coatings with different particles sizes in an order of decreasing particle size from the support to surface. The support structure 504 is intact or experiences minimal changes during the membrane formation process. The support structure 504 is preferably made of metallic backbones.

Sintering of porous ceramic coatings on a porous ceramic support by high-temperature heating in an oxygen-containing gas environment is known in the membrane field. For example, porous zirconia membranes supported on a porous alumina tube can be sintered by heating at above 1000° C. in air. However, sintering of a durable ceramic-type membrane 514 on a metal-based support structure 504 is extremely challenging. The metal support structure 504 can be damaged or destroyed by heating above 500° C. in a $O_2$-containing gas environment. Even in an inert or reducing gas environment, the porous metallic support structures 504 can experience significant shrinkage at high temperatures. A decarbonization and sintering process with controlled temperature gradient and gas environment is provided herein to form a micro-porous ceramic membrane on the preformed metal-based support structure 504:

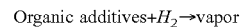

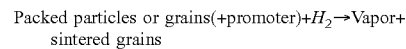

The non-volatile organic additives 508 incorporated in the green part 100 during the coating process are removed into the vapor phase by pyrolysis, decomposition, cracking, and/or hydrogenation. The sacrificial material introduced in pre-reforming of the coating particles with addition of the sintering promoter 510 is removed as well during sintering of the grains.

Figure 6A:
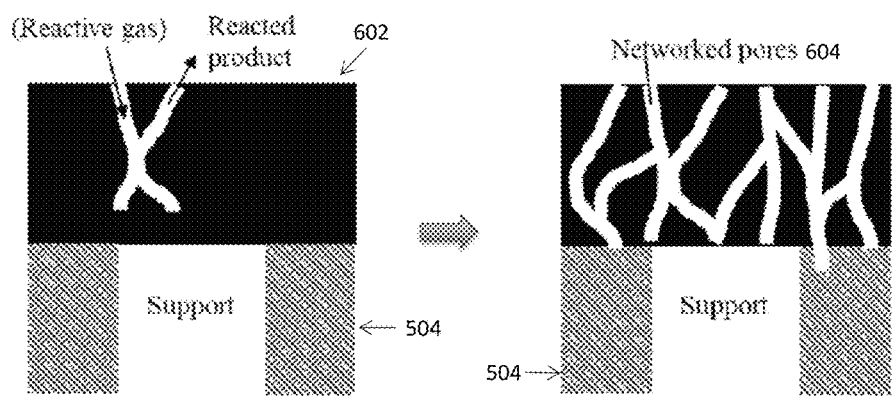
Figure 6B:
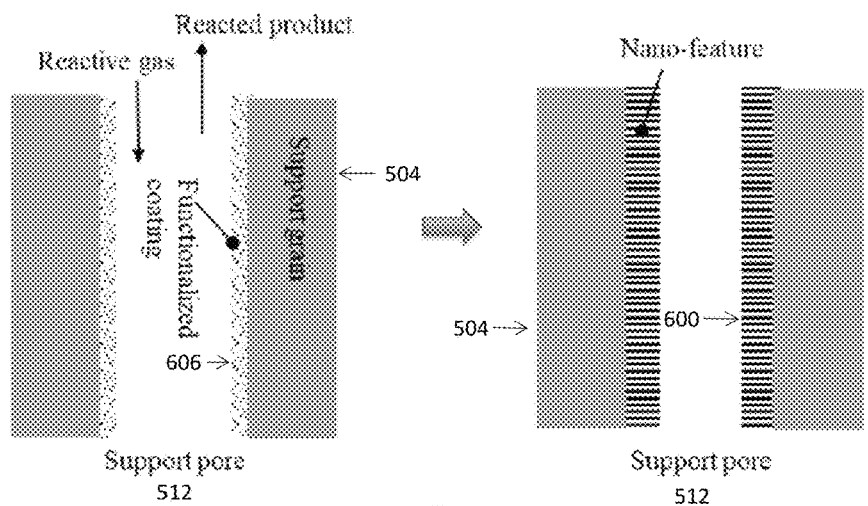

Additional porous structures may be formed out of a green part 602 comprising dense or less porous material supported on a porous support structure 504 as illustrated in FIGS. 6A and 6B. FIG. 6A show conversion of a dense or less porous coating layer 602 on a porous support structure 504 into a networked porous structure 604 through solid/vapor reactions. For example, a carbon precursor can be coated on the support structure as a dense or less-porous layer at low temperatures (<100° C.) and may be converted into micro-porous carbon film by chemical reactions at high temperatures (500-900° C.).

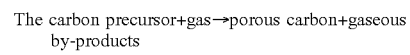

The pores 604 are generated by removing a fraction of the carbon in the green part 602. In an embodiment, the carbon precursor material can be phenolic resins and furthermore, thermoset-type phenolic resin, in which oxygen atom in the precursor material can act as an in-situ reactant to generate porous structures. $CO_2$ gas may be added to react with the carbon to form CO. $H_2O$ vapor may be added to react with the carbon to form $H_2$ and CO. Hydrogen gas can be used to react with carbon to form methane.

Another example is formation of a micro-porous silicone carbide film or membrane 604 by reacting a functionalized film 602 on the support 504 with carbosilane-type vapor at temperatures of 500-900° C.:

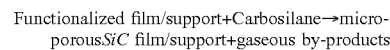

The carbosilane is a source of C and Si atoms to form silicone carbide. The support is functionalized, forming a functionalized coating 602, to promote, direct, and/or catalyze deposition and reaction of gaseous carbosilane on the support 504 to form a porous silicone carbide film 604. For example, the support 504 can be functionalized by impregnation or coating of alumina of particle sizes less than 100 nm. Similarly, a micro-porous silica membrane or film 604 can be formed by the gas/solid reaction with a vapor-phase precursor containing Si and O atoms:

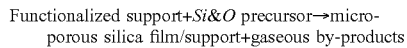

Functionalized support+$Si\&O$ precursor→microporous silica film/support+gaseous by-products Examples of the Si and O-containing precursor include vinyltriethoxysilane (VTES) and tetraethoxyorthosilicate (TEOS). In this conversion process, the support can be functionalized by coatings of alumina of particle size less than 100 nm. A small fraction of Ni, Fe, and/or Co may be added into the coating.

The new porous structures can be formed inside the pores of a porous support structure. As shown in FIG. 6B, surface of the metallic grains inside a porous metal-based support structure may be functionalized, such as by deposition of a catalyst to form a functionalized support 606. Under the reactive conditions, a gas reactant diffuses into the pores 512 of the support to form new structures 600. Such a process is illustrated with growth of carbon nanotubes inside the support pores:

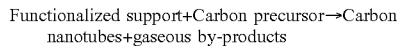

Functionalized support+Carbon precursor→Carbon nanotubes+gaseous by-products

The metal-based porous support can be functionalized by deposition of transition metal catalysts, such as Fe, Ni, and/or Co, on the surface of metallic grains inside the support. The carbon precursor can be, but is not limited to, CO, methane, ethanol, ethane or ethylene in an inert carrier gas such as nitrogen. The chemical vapor deposition or gas/solid reaction may be carried out at temperatures from 500 to 900° C.

Figure 7:
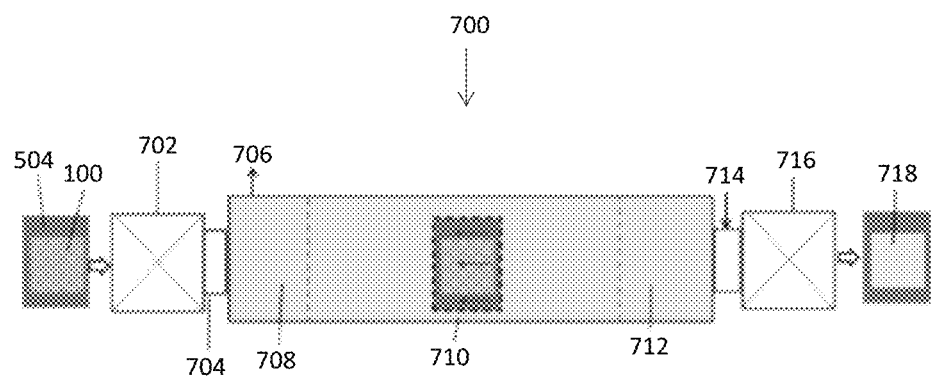
FIG. 7 is a schematic illustration of an apparatus for continuous production of micro-porous structures according to an embodiment.

The common features of above-described formation processes of micro-porous structures are i) reaction of gaseous reactant with the green part at high temperatures (500 to 1200° C.), ii) evolution of gaseous byproducts, and iii) reducing or inert gas environment with substantial absence of oxygen gas. The reaction temperature should be well controlled to achieve the designed level of reaction conversion. The gaseous reactant should be constantly supplied and the gaseous byproducts should be constantly removed. Therefore, a continuous production process is presented by this embodiment to produce the porous structures economically at large scales. The porous structures can be in various forms or shapes, such as sheets, tubes, and monoliths. A flat sheet form is preferred, because its simple geometry renders high throughput handling. Furthermore, the sheet thickness is preferably thin, less than 1 mm or less than 200 µm. The thinness of the sheet reduces diffusion mass transfer resistance and increases stacking density of the sheets. The basic functional units of a continuous production system 700 are shown in FIG. 7. The green parts 100 located on supports 504 are fed into an inlet gas exchange chamber 702 where oxygen or air entrained into the chamber is removed, such as by sweep with an inert gas. The green parts 100 are moved into a preheating section 708 via a gas-tight connector 704. In the preheating section, volatile or thermally-unstable constituents in the green parts are removed via an exhaust outlet 706. Then, the green parts 504 are moved into a reaction and sintering section 710 where the green parts 504 react with a gas flow, provided via a gas inlet 714, to form product parts 718 of desired porous structures. The product parts 718 are moved into cooling section 712. After the product parts 718 are sufficiently cooled down, the product parts 718 are moved into an outlet gas exchange chamber 716 where the reactive gas entrained by the product parts 718 are removed, such as by sweep with inert nitrogen gas. The green parts 100 are continuously fed while the product parts 718 are continuously moved out. The reactive gas is continuously introduced into the reaction and sintering section 710 to purge the gaseous products out of the furnace and supply the reactant to react with the green part 100, while the reacted gas stream is continuously discharged. The feed gas may be introduced at different locations or sections, while the reacted gas may be discharged at different locations or section. For example, the feed gas may be introduced at the cooling section 712, reaction and sintering section 710, and the preheating section 708 to meet specific needs to the gas flow rate and compositions in respective sections 708, 710, 712. The gas flow direction is preferably opposite to the moving direction of the green parts 100. The feed gas composition is determined by specific reaction conversion need. If conversion of the green parts to the product parts 718 is limited by hydrogen reaction, pure hydrogen is used. If the conversion requires a small fraction of active reactants, such as $CO_2$, $H_2O$, CO, ethanol, $CH_4$, carbosilane, or TEOS, an inert carrier gas, such as nitrogen, argon and Helium, can be used. One feature of the present system 700 is that the feed gas should be substantially free of oxidants, such as oxygen, to protect the formed porous structure 718 from being oxidized.

Figure 8:
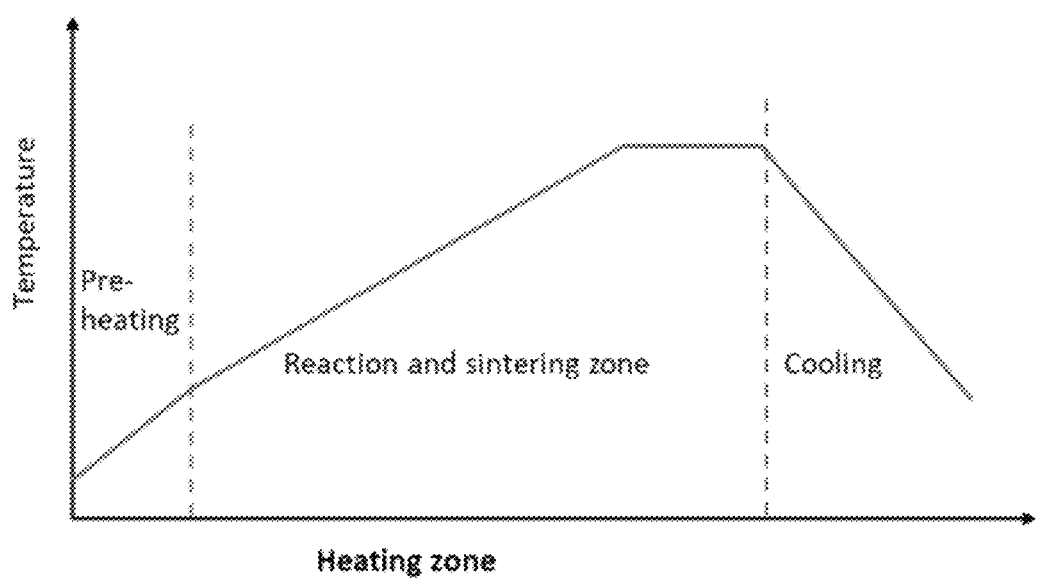
FIG. 8 is a plot illustrating the temperature profiles of three reactor sections of a tunnel furnace according to an embodiment.

The preheating 708, reaction and sintering 710, and cooling sections 712 may be built as mutually-connected individual sections or as different zones in one reactor body. The three sections are controlled with different temperature profiles. As illustrated in FIG. 8, the green part 100 is heated from ambient temperature to moderate temperatures such as 200-400° C. in the preheating zone 708. In the reaction and sintering zone 710, the green part 100 may be heated to and held at much higher temperatures. For example, the temperature is as high as 1000-1300° C. for formation of micro-porous stainless-steel structures. The temperature required for formation of porous nickel and nickel alloy is about 750 to 900° C. For sintering of porous ceramic coatings on a porous metal structure, the temperature is about 700 to 1100° C. For formation of micro-porous carbon membrane, silica membrane, silicone carbide membrane or growth of carbon nanotubes, the temperature is about 500 to 900° C. The reaction and sintering section 710 should have sufficiently high aspect ratio to control the temperature profile. The aspect ratio is defined as ratio of the reactor length to width of the reaction tunnel or diameter for a rounded reaction channel. The aspect ratio is preferably greater than 2.

Figure 9A:
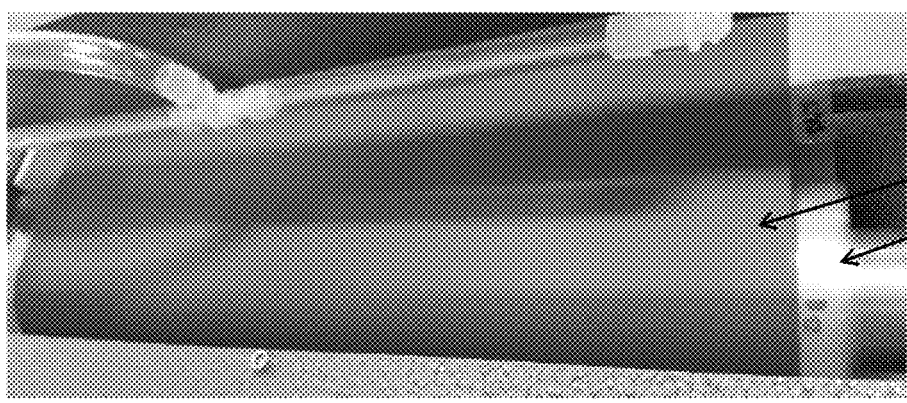
FIGS. 9A-9C are photographs illustrating the morphologies of green tape and porous metal sheet produced according to an embodiment; where
Figure 10A:
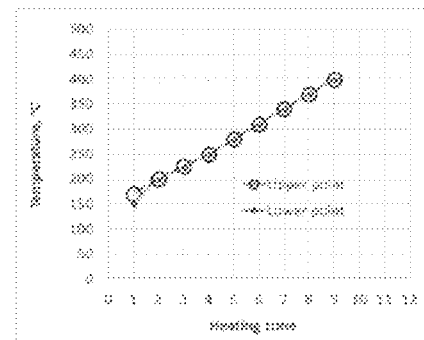
FIGS. 10A and 10B are plots illustrating the tunnel furnace temperature profiles used for conversion of nickel oxide green tapes into porous nickel alloy sheets according to an embodiment.
Figure 10B:
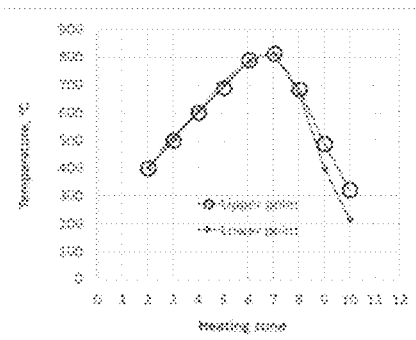

Example I: Conversion of Nickel Oxide Green Tapes into a Thin Porous Metal Sheet A green tape comprising nickel oxide particles was converted into thin porous Ni alloy sheets in a continuous tunnel flow reactor. The green tape thickness was about 70 µm with the composition listed in Table 1. As shown in FIG. 9A, the thin green tape 900 is flexible enough to be wrapped on a roller 902. The green tape 900 was cut into 35 cm×35 cm coupons and set on a durable substrate plate to be processed in a tunnel flow reactor or environment-controlled tunnel furnace. The tunnel furnace temperature was maintained by use of many independently-controlled electrical heaters along the furnace length. FIG. 10 shows the temperature profiles in the three sections. In the pre-heating section (FIG. 10A), the temperature was gradually increased to 400° C. through nine heating zones. In the reaction section (FIG. 10B), the temperature was raised from 400° C. to 810° C. in six heating zones. The temperature was dropped from 810°

C. to 200-300° C. in only three heating zones in the cooling section 712. In the preheating, reaction and sintering sections 708, 710, the temperatures in lower and upper points of the tunnel were maintained almost the same to achieve uniform de-gas, reaction, and sintering over the cross-section of the tunnel. The green tapes 900 were continuously moved through the tunnel and experienced significant temperature variance along the tunnel length. The de-gas, reaction, and sintering rates should be well controlled and balanced to prevent formation of defects, such as cracks, wrinkling, and pinholes. After the porous metallic structure 102 is formed, the porous metal sheet 102 can tolerate a larger degree of temperature variation. Thus, the temperature gradient among two heating zones can be much greater in the cooling section than in the preheating 708 and reaction sintering 710 sections. Pure hydrogen gas was introduced into the reactor tunnel at end of the cooling section and discharged at the beginning of the preheating section 708, i.e., the hydrogen flow direction was opposite to the green part movement. After the desired temperature profiles and hydrogen gas flow were stabilized, stacks of the green tapes were pushed into the preheating section 708 and pushed out of the cooling section 712 continuously one by one.

Figure 9B:
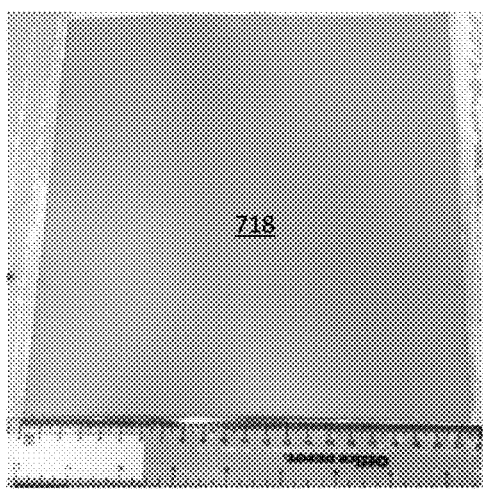
Figure 9C:
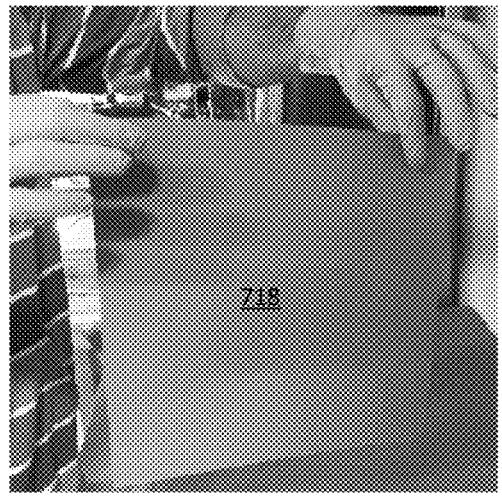

FIG. 9B shows a thin porous Ni alloy sheet 718 produced from the continuous furnace. The thin sheet 718 was laid on a rigid and stable substrate plate. The sheet 718 looked flat and free of any defects. The thin metal sheet 718 presents much higher strength than the green tape 502. FIG. 9C shows that the porous metal sheet 718 is strong enough to be self-supported. No light penetration or pin-holes are seen on the sheet 718. Any holes that allow the light to go through indicate that the hole is too large. In the continuous production process, the stacks of green tapes 502 are fed into the tunnel reactor one by one or stack by stack. Sizes and porosity of a few consecutive stacks processed under the same conditions are summarized in table 2. The average thickness and porosity of these stacks listed in Table 2 are 46±2 μm and 40±3%, respectively. These variances are acceptable to most practical applications.

TABLE 2

Porous thin Ni sheets produced by a continuous process

| Stack # | Width, cm Avg. | Width, cm STDEV | Thickness, μm Avg. | Thickness, μm STDEV | Geometric Porosity |
|---|---|---|---|---|---|
| 1-2 | 23.7 | 0.1 | 44 | 3 | 0.44 |
| 1-3 | 23.3 | 0.1 | 45 | 2 | 0.43 |
| 1-4 | 23.4 | 0.3 | 44 | 2 | 0.41 |
| 1-5 | 23.4 | 0.2 | 45 | 3 | 0.43 |
| 1-6 | 23.7 | 0.1 | 44 | 1 | 0.43 |
| 2-1 | 23.9 | 0.3 | 44 | 1 | 0.43 |
| 2-2 | 23.4 | 0.2 | 46 | 2 | 0.43 |
| 2-3 | 23.5 | 0.2 | 43 | 2 | 0.43 |
| 2-4 | 23.4 | 0.1 | 44 | 1 | 0.42 |
| 2-5 | 23.5 | 0.1 | 44 | 2 | 0.42 |
| 2-6 | 23.4 | 0.2 | 47 | 2 | 0.44 |
| 3-1 | 23.7 | 0.1 | 46 | 2 | 0.45 |
| 3-2 | 23.2 | 0.3 | 45 | 1 | 0.41 |
| 3-3 | 23.1 | 0.1 | 44 | 2 | 0.40 |
| 3-4 | 23.3 | 0.1 | 45 | 1 | 0.41 |
| 3-5 | 23.5 | 0.1 | 45 | 3 | 0.42 |
| 3-6 | 23.5 | 0.1 | 45 | 2 | 0.42 |
| 5-1 | 23.0 | 0.2 | 44 | 2 | 0.38 |
| 5-2 | 22.5 | 0.2 | 44 | 2 | 0.36 |
| 5-3 | 22.5 | 0.2 | 46 | 1 | 0.38 |
| 5-4 | 22.6 | 0.2 | 44 | 2 | 0.36 |
| 5-5 | 22.6 | 0.1 | 45 | 2 | 0.38 |
| 5-6 | 22.5 | 0.1 | 46 | 2 | 0.37 |
| 5-7 | 22.4 | 0.1 | 45 | 0 | 0.36 |
| 5-8 | 22.5 | 0.1 | 47 | 3 | 0.38 |
| 6-1 | 23.0 | 0.2 | 44 | 2 | 0.38 |
| 6-2 | 22.4 | 0.1 | 47 | 1 | 0.37 |
| 6-3 | 22.3 | 0.1 | 47 | 2 | 0.37 |
| 6-4 | 22.4 | 0.1 | 48 | 2 | 0.39 |
| 6-5 | 22.6 | 0.2 | 47 | 2 | 0.39 |
| 6-6 | 22.4 | 0.2 | 47 | 2 | 0.38 |
| 6-7 | 22.5 | 0.2 | 47 | 1 | 0.38 |
| 6-8 | 22.6 | 0.1 | 46 | 2 | 0.37 |
| 8-1 | 23.5 | 0.1 | 48 | 1 | 0.44 |
| 8-2 | 23.0 | 0.2 | 49 | 3 | 0.43 |
| 8-3 | 22.8 | 0.1 | 47 | 2 | 0.40 |
| 8-4 | 22.8 | 0.2 | 49 | 1 | 0.42 |
| 8-5 | 22.8 | 0.1 | 47 | 2 | 0.40 |
| 8-6 | 22.8 | 0.4 | 46 | 1 | 0.38 |
| 9-1 | 23.5 | 0.4 | 47 | 2 | 0.42 |
| 9-2 | 22.8 | 0.2 | 46 | 3 | 0.38 |
| 9-3 | 22.6 | 0.2 | 47 | 3 | 0.38 |
| 9-4 | 22.6 | 0.2 | 50 | 3 | 0.42 |
| 9-5 | 22.7 | 0.2 | 48 | 3 | 0.41 |
| 9-6 | 22.8 | 0.2 | 49 | 3 | 0.42 |
| 10-1 | 23.6 | 0.3 | 48 | 2 | 0.44 |
| 10-2 | 22.9 | 0.3 | 49 | 1 | 0.41 |
| 10-3 | 22.6 | 0.2 | 49 | 4 | 0.40 |
| 10-4 | 22.6 | 0.2 | 50 | 3 | 0.41 |
| 10-5 | 22.5 | 0.2 | 48 | 2 | 0.37 |
| 10-6 | 22.6 | 0.1 | 47 | 2 | 0.39 |

Figure 11A:
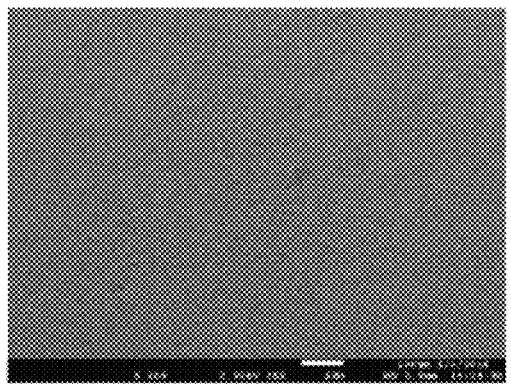
FIGS. 11A-11C are SEM micrographs illustrating the microstructure at various magnifications of porous metal sheets produced according to an embodiment.
Figure 11B:
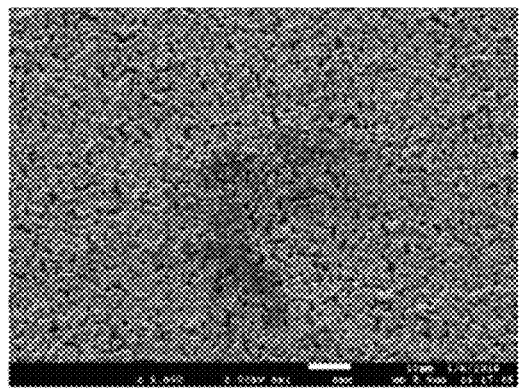
Figure 11C:
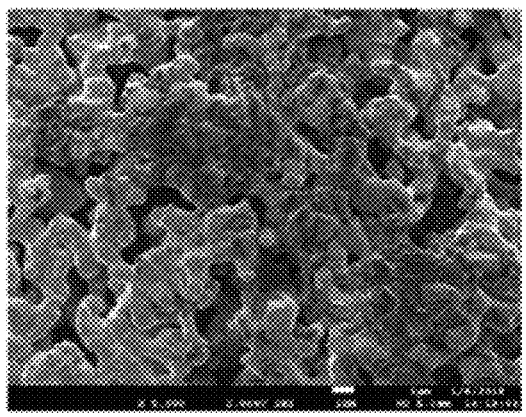
Figure 11D:
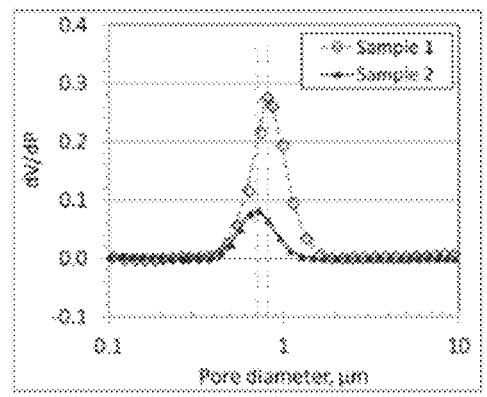
FIG. 11D is a plot illustrating the surface pore size distribution of the sheet illustrated in FIGS. 11A-11C.

The porous structures of the resulting metal sheet can be seen under electron scanning microscopy (SEM). FIGS. 11A-C show scanning electron microscope (SEM) images under different magnification. At 100× magnification (FIG. 11A), a smooth surface is seen, and pores are not visible yet. At 1000× (FIG. 11B) magnification, the porous structure and surface features become evident. The image at 5000× magnification (FIG. 11C) shows neck-to-neck sintering of metallic grains, pores or voids formed among the grains, and some carbon residuals. The porous surface structure looks uniform and no pore size greater than 5 μm are seen. FIG. 11D shows the surface pore size distribution of two representative porous Ni alloy sheets produced in this embodiment. Consistent with SEM analysis, narrow pore size distribution is shown by both samples, although there is about 0.1 μm shift in the peak pore size. The pores are within the range of 0.4 to 2.0 μm, i.e., at the sub and micrometer scale.

Example II: Sintering of Micro-Porous Ceramic Coating on the Porous Metal Sheet Support Two porous Ni alloy sheets produced from the continuous hydrogen furnace with respective thicknesses of 49±1.6 μm and 47±1.3 μm were used as a support structure 504. They were cut into 3.5 cm×5.5 cm coupons for preparation of porous ceramic membranes of pore sizes much smaller than the support. The ceramic particles were coated on a 3.0 cm×5.0 cm area of the coupon by vacuum filtration of a coating slurry. The ceramic particle used for first layer coating was yttria-stabilized zirconia (YSZ) of 200 nm mean particle size. The YSZ particle was impregnated with 1.1 wt. % nickel oxide as a sintering promoter. The 1$^{st}$ coating slurry included 0.5 wt. % of the 200 nm YSZ solid, 0.013 wt. % of organic dispersant, and 0.013 wt. % of organic binder in isopropanol solvent. The slurry volume used for the first layer of coating is listed in table 3. The metal surface was fully covered by first coating to form a smooth, uniform coating layer. Then, second coating with 50 nm YSZ particles was applied. The second coating slurry included 0.25 wt. % of the 50 nm YSZ particle, 0.006 wt. % of the dispersant and 0.006 wt. % of the binder. The volume of the coating solution used is listed in table 3. The coated samples were dried in ambient air conditions. The amount of coating is normalized by the coated area as surface loading density, mg/cm$^2$. The as-coated layer, comprising stacking of the YSZ particles, was very loose such that it could be easily wiped or rinsed away from the support sheet. It should be sintered to form a stable structure.

TABLE 3

Micro-porous ceramic membranes supported on the thin porous metal sheet

| ID No. | Metal sheet thickness, μm | Porosity, % | 1$^{st}$ coating slurry usage, ml | 2$^{nd}$ coating slurry usage, ml | Coating loading, mg/cm$^2$ | Coating thickness after sintering, μm | Electrical conductivity |
|---|---|---|---|---|---|---|---|
| 1 | 49 | 42 | 3 | No | 1.05 | NA | NA |
| 2 | 49 | 45 | 3 | 1 | 0.64 | 9 | NA |
| 3 | 49 | 47 | 3 | 1 | 0.79 | 2 | Yes |
| 4 | 49 | 45 | 3 | 1 | 0.77 | 3 | Yes |
| 5 | 49 | 47 | 6 | 2 | 1.57 | NA | NA |
| 6 | 49 | 43 | 6 |   | 1.67 | 5 | Yes |
| 7 | 49 | 44 | 6 | 2 | 1.61 | 5 | Yes |
| 8 | 49 | 44 | 5 | 2 | 1.82 | 6 | NA |
| 9 | 49 | 42 | 10 | 4 | 3.58 | 20 | No |
| 10 | 47 | 43 | 10 | 4 | 3.24 | 23 | No |
| 11 | 47 | 43 | 10 | 4 | 3.12 | 11 | No |
| 12 | 47 | 43 | 10 | 4 | 4.17 | 15 | No |
| 13 | 47 | 41 | 10 | 4 | 3.18 | NA | NA |

NA = not measured.

Figure 12A:
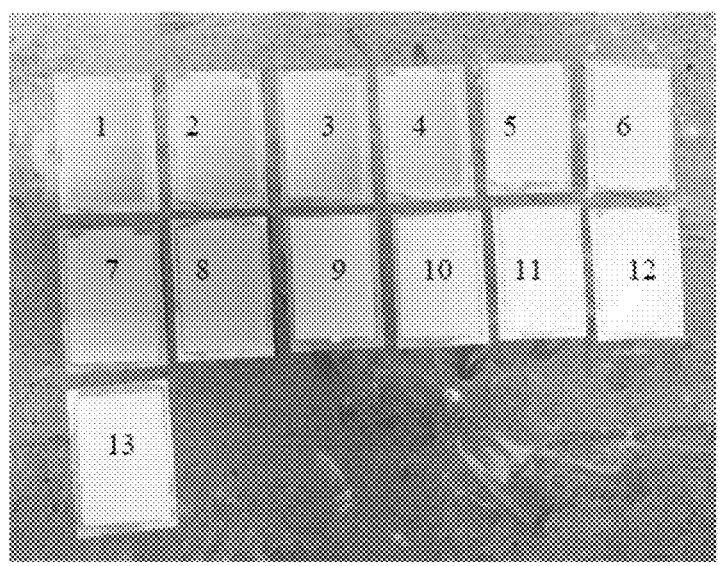
FIGS. 12A and 12B are photographs illustrating the morphologies of micro-porous ceramic coatings on the thin porous metal sheets according to an embodiment.
Figure 12B:
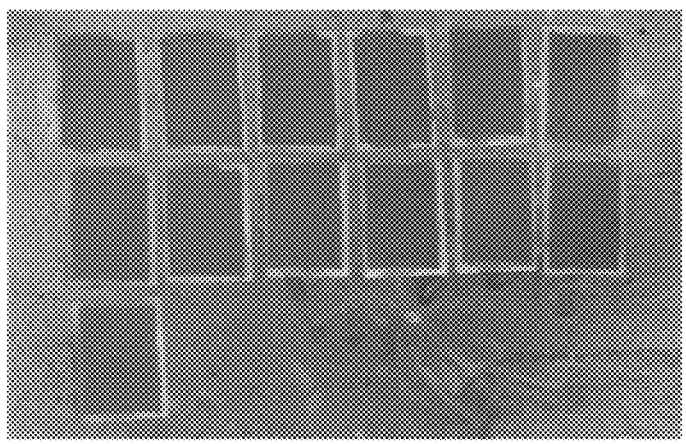

All the membrane coupons were placed on one support plate, fed into the continuous tunnel reactor, and sintered under the same conditions as the green nickel oxide tape described in the previous example. Morphologies of all the coupons before and after sintering are compared in FIG. 12. As-coated samples looked white or pale, which reflects packing of the YSZ particles. Color of all the samples darkened after sintering, which indicates sintering of the YSZ crystalline with incorporation of the sintering promoter. The sintered coupon looks flat and uniform. By varying loading of the coated materials, the membrane of different thickness was obtained. No crack, delamination, or deformation occurred among all the thirteen samples of thickness ranged from 2 to 23 μm. After sintering, the ceramic coating layer adhered to the porous Ni support sheet as an integrated body. The sintered membrane was soaked in a 50 wt. % KOH solution and no crack occurred. Electrical conductivity of the ceramic coating was tested. The results show that the coating layer does not present any electrical conductivity when its thickness is at about or above 10 μm, which suggests that the metallic surface was fully insulated by the ceramic coating.

YSZ is a refractory material. Formation of porous YSZ membranes on a ceramic support typically requires sintering temperatures above 1000° C. in air or oxygen-containing gas environment. It has been very difficult to sinter YSZ coatings on a porous metal support structure due to the limitation of the metallic material properties. In an oxygen-containing gas environment, the metallic structure would be oxidized and destroyed at high temperatures. Even in an oxygen-free gas environment, the metallic structure can experience dramatic shrinkage when heated at high temperatures, which would result in cracks and/or delamination of the ceramic coating layer. This example demonstrates the feasibility to prepare thin (<40 μm) porous ceramic membranes or coatings on the porous metal-based support structures through reactive processes under controlled temperature and gas flow profiles in a continuous reactor system.

Figure 13A:
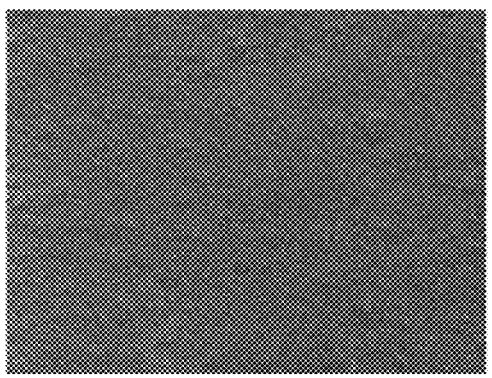
FIGS. 13A-13D are SEM micrographs illustrating structures of a 200 nm YSZ coating on the thin porous metal sheet at different magnifications according to an embodiment.
Figure 13B:
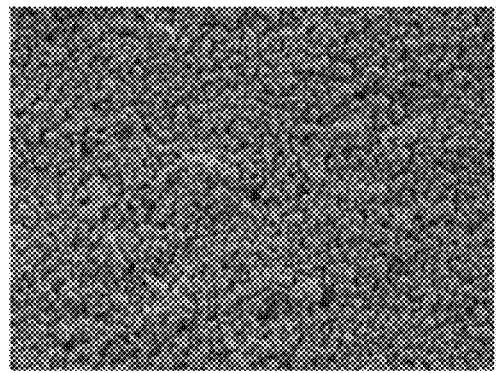
Figure 13C:
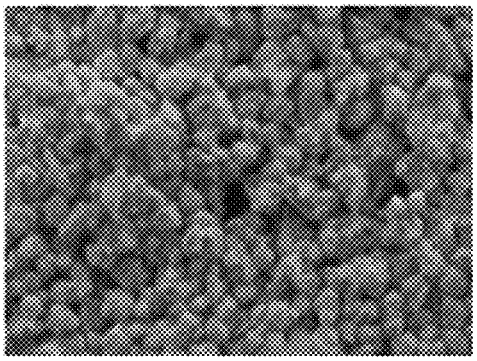
Figure 13D:
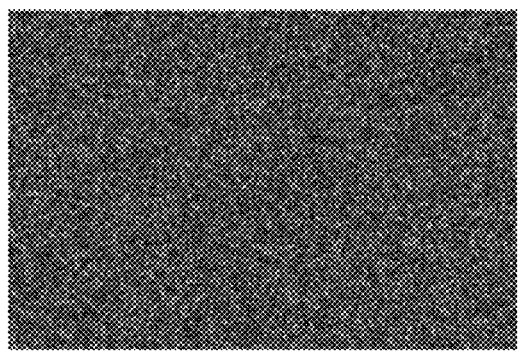
Figure 14A:
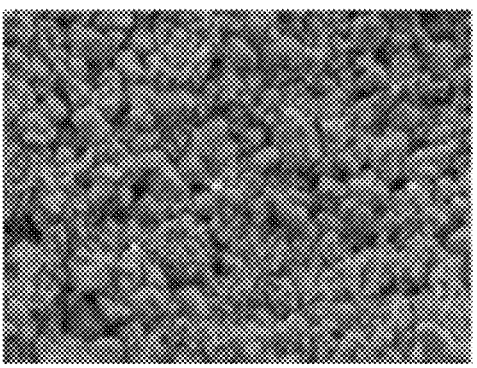
FIGS. 14A and 14B are SEM micrographs of structures of a 50 nm/200 nm YSZ coating on a thin porous metal sheet at different magnifications according to an embodiment.
Figure 14B:
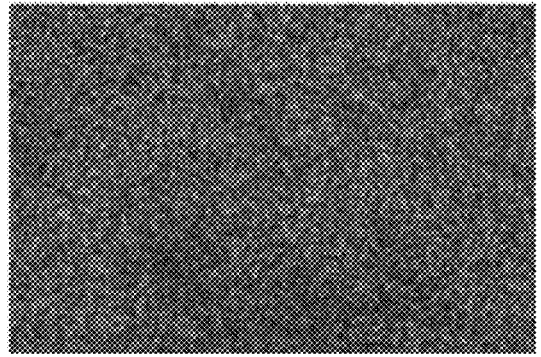
Figure 15A:
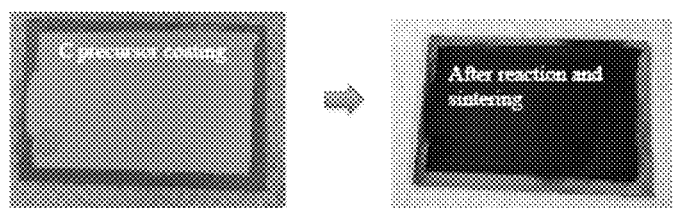
FIGS. 15A-15D are photographs illustrating the conversion of carbon precursor coatings on the porous metal-based supports into micro-porous carbon films according to an embodiment.
Figure 15B:
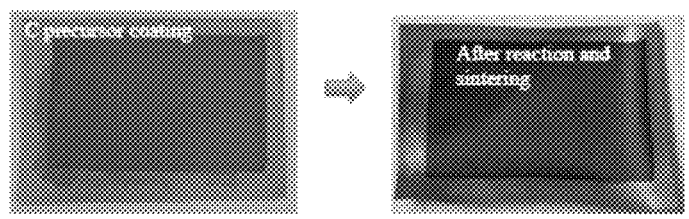
Figure 15C:
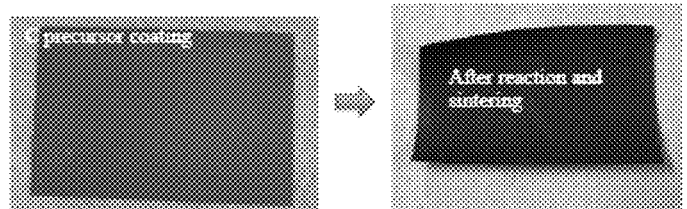
Figure 15D:
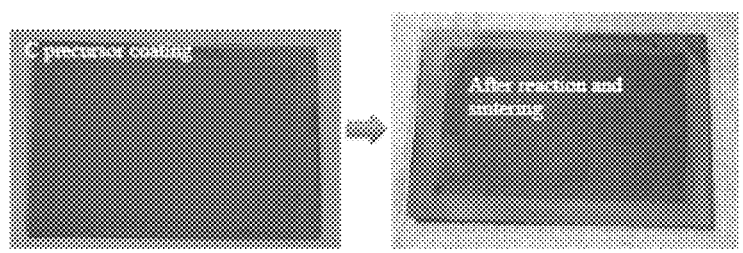

The YSZ coating dramatically reduces surface pore sizes. Micro-structures of the porous metal sheet coated with the 200 nm YSZ particles are shown in FIGS. 13A-C at different magnification (2,500; 15,000; 50,000). Compared to the surface pore structure of the metal support sheet (FIG. 11), the YSZ coating surface looks much smoother and comprises pores in the tens of nm. The surface pore size is reduced by about an order of magnitude relative to the pores in the metal sheets. Under 50,000× magnification, FIG. 13C shows that the neck-to-neck sintering of the YSZ crystalline grains occurred. Uniform distribution of the promoter (NiO) is revealed by elemental mapping of Zr, Ni, and Y in FIG. 13D (5,000× magnification). No segregated NiO phase was found. The surface pore size was further reduced by applying the 50 nm YSZ coating on the 200 nm coating. Compared to FIG. 13C, FIG. 14A (50,000× magnification) shows that large pores between the 200 nm crystalline grains were substantially filled by the 50 nm YSZ crystalline and finer surface pores were formed. The elemental mapping at 5000× magnification in FIG. 14B also confirms uniform distribution of Zr, Y, and Ni elements. The NiO promoter was incorporated into the YSZ crystalline after sintering.

Example III: Formation of Micro-Porous Carbon Coating on the Thin Metal Sheet-Based Support The carbon precursor was coated on the porous Ni sheet support by vacuum filtration. The coating material and loading density for four samples are listed in Table 4. The support sheet was cut into 3.5 cm×5.5 cm coupons. The coating was deposited on the coupon in 3 cm×5 cm region. In first two samples, phenol-formaldehyde thermosetting (PFT) resin solution in ethanol was used. The 50 nm/200 nm YSZ-coated porous Ni sheet was as used for sample 1 and the bare porous Ni sheet of about 50 μm thickness was used for sample 2 to see the impact of the support surface on formation of micro-porous carbon membranes. The phenol-formaldehyde thermoplastic resin (PFTP) solution in ethanol was used for samples 3 and 4. The support used for sample 3 was the porous Ni sheet grown with a NaA-type zeolite membrane. For comparison, the bare Ni sheet was used as a support for sample 4. The coated sample was dried to remove all the solvent and volatile component. The surface loading density of the carbon precursor, i.e., phenol-formaldehyde resin, is listed in Table 3. The dried samples were loaded into a tunnel reactor with continuous nitrogen gas flow. The samples were heated from room temperature to 700° C. and held at 700° C. for 1 h to remove oxygen and a fraction of carbon from the carbon precursor, and to form micro-porous carbon structures. The last column in Table 4 shows that weight loss of the coating material was greater than 50% for all the samples. The morphology changes are shown in FIG. 15. After the reaction, a continuous porous carbon layer was formed on both sample 1 and sample 2. Sample 1 remained flat, while sample 2 curled slightly. Significant curling occurred with sample 3. No continuous carbon film was formed on sample 4, due to an insufficient amount of coating, penetration into the support pore, and/or excessive decarbonization.

TABLE 4

Carbon coating on porous metal support sheet

| Sample No. | Coating solution | Support | Overall coating thickness on the metal sheet, μm | Coating density of carbon precursor, mg/cm² | Carbon precursor loading, wt. % of support sheet | Carbon coating weight loss, wt. % |
|---|---|---|---|---|---|---|
| 1 | 35 ml, 2 wt.% of PFT | 50 nm/200 NM YSZ-coated Ni sheet | 39 | 0.7 | 1.9% | −65% |
| 2 | 3 ml of 20 wt. % of PFT | Bare Ni Sheet | 27 | 1.1 | 2.4% | −63% |
| 3 | 35 ml of 2 wt. % of PFTP | NaA-type zeolite grown on the metal sheet | 17 | 0.4 | 1.0% | −54% |
| 4 | 35 ml of 2 wt. % of PFTP | Bare Ni Sheet | 13 | 0.9 | 2.2% | −83% |

The example demonstrates the feasibility to form new micro-porous structures from a dense or less porous coating precursor on the porous metal support structure by reaction in flowing gas under a certain temperature profile.

Figure 16A:
FIGS. 16A-16B are photographs illustrating morphologies of three porous Ni sheet coupons functionalized for carbon nanotube growth according to an embodiment.
Figure 16B:
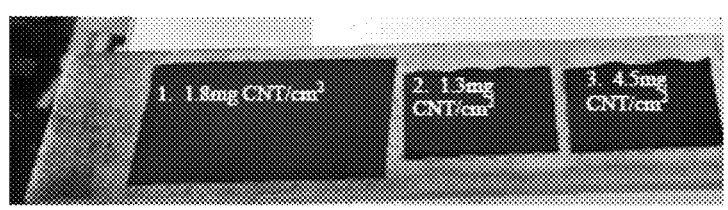
Figure 17A:
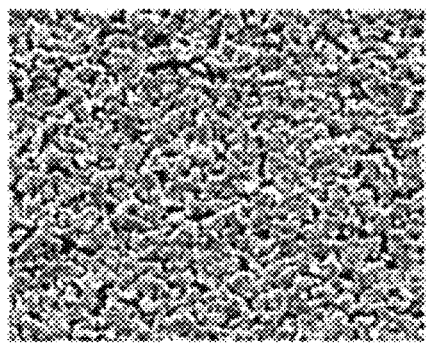
FIGS. 17A-17E are SEM micrographs under different magnification illustrating carbon nanotubes grown inside pores of a porous Ni sheet.
Figure 17B:
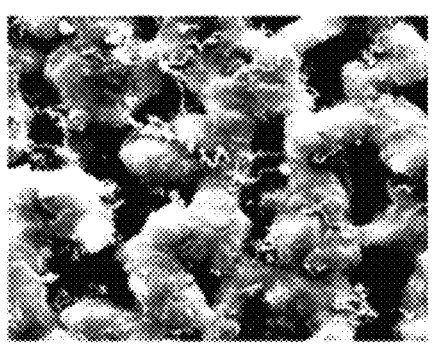
Figure 17C:
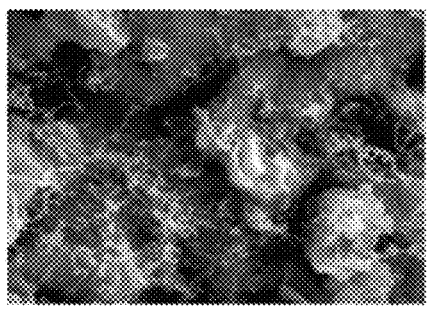
Figure 17D:
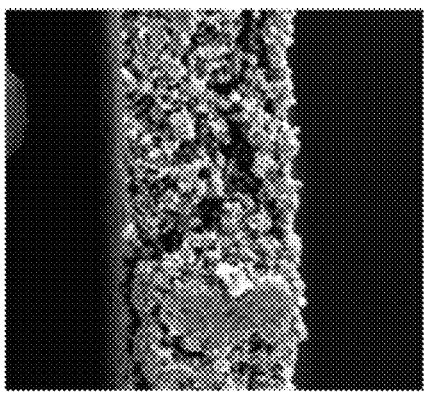
Figure 17E:
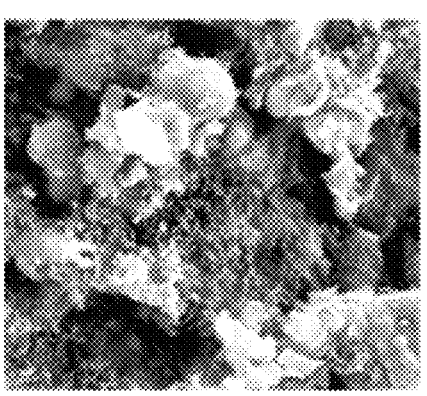

Example IV: Formation of Micro-Porous Structures Inside Pores of a Porous Metal Support A porous Ni sheet of about 50 μm thickness was used as a support. Three support coupons were impregnated with 0.1M iron nitrate, cobalt nitrate, and Ni nitrate solutions, respectively. After drying, the metallic grains inside pores of the three metal support sheets were functionalized by respective Fe, Co, and Ni catalyst. The functionalized coupons were placed inside a tunnel reactor. The reactor was first purged by nitrogen gas flow and then by hydrogen gas flow. The reactor was heated to 650° C. in continuous hydrogen gas flow. At 650° C., the hydrogen gas flow was switched to ethanol/nitrogen gas flow. The sample was exposed to the ethanol/nitrogen gas flow for about 10 min. Carbon nanotubes (CNT) were grown inside the pores of the metal support sheet. FIG. 16 shows morphologies of the coupons before and after the reaction. The functionalized porous Ni sheets looked like the original nickel sheet, because most catalyst was fixed inside the pores. All the three coupons looked black after the reaction growth. The sheets basically remained flat but with slight deformation on the edges. Under the same conditions, different amounts of the CNT loading were obtained with the three catalysts. The Ni catalyst resulted in the largest CNT loading. The presence of CNT inside the pores was confirmed by SEM analysis. FIGS. 17A and 17B show the surface textures of the porous Ni sheet with CNT grown on the Fe catalyst seeding (sample 1 in FIG. 16B) under 3,000 and 20,000× magnification, respectively. It can be seen that the pores of the nickel support sheet remained intact, but CNT features were added inside the pores. The Fe catalyst promoted formation of CNT of 50-100 nm diameter and several micrometer long Similar CNT growth was promoted by the Co catalyst. FIG. 17C shows the surface texture of the porous Ni sheet with CNT grown on the Co seeding (sample 2 in FIG. 16B) under 30,000× magnification. The Ni catalyst promoted growth of CNT of smaller diameter (30-50 nm). The analysis of the fractured wall confirmed growth of the CNT throughout the support sheet thickness. FIGS. 17D, 17E show the fractured porous Ni sheet wall with CNT growth on the Ni sheet (sample 3 in FIG. 16B) under 1,600 and 20,000× magnification, respectively. This example demonstrates the feasibility to grown smaller porous structures inside the pore of a porous metal support structure through gas/solid reactions in continuous gas flow.

While several embodiments of the present invention have been shown and described, it will be apparent to those skilled in the art that many changes and modifications may be made without departing from the invention in its broader aspects. The appended claims, therefore, are intended to cover all such changes and modifications as they fall within the true spirit and scope of the invention.

The following references are hereby incorporated by reference in their entirety.

Ruben Samuel "Process for producing microperforated stainless steel sheets" U.S. Pat. No. 3,352,769A (Original Assignee: Ruben Samuel; Priority date: 1967-01-11). An electrically controlled process for producing microperforated stainless steel which comprises connecting a sheet of stainless steel having a thickness between approximately 0.0005" and 0.005", containing intergranular iron chromium precipitates and containing as essential elements a preponderance of iron and a lesser but significant amount of chromium as the anode in an electrolytic cell having a non-polarizing electrolyte and a cathode and discharging direct current through said cell so as to anodically dissolve intergranular iron chromium precipitates in said sheet and to thereby produce a multiplicity of light transmitting microperforations through said sheet, the microperforations being primarily due to electrochemical action.

Anthony J. Vaccaro, Kenneth J. Gregg, Daniel W. Gibbons, Janet S. Gregg, John R. Griesser "Conductive metal porous sheet production" U.S. Pat. No. 5,738,907A (Current Assignee: Stork Screens BV; Original Assignee Eltech Systems Corp; Priority date: 1995-08-04). A porous product, typically a metal foam sheet, is produced as a tailored, engineered product. Thus, an engineered product can be produced which, for example, as an open-cell metal foam prepared from a polymeric foam can have conductivity, both thermal and electrical, as well as strength and ductility, tailored for greater uniformity and performance.

Hirofumi Sugikawa "Method of manufacturing a metal sheet" U.S. Pat. No. 5,850,591A (Current Assignee: Katayamo Special Industries Ltd; Original Assignee: Katayamo Special Industries Ltd; Priority date: 1996-04-19). A method of manufacturing a porous metal sheet having pores forming a pattern, comprising the steps of supplying metal powders to a peripheral surface, of at least one pattern roller of a pair of rollers, on which a pattern including a large number of concaves is formed; dropping metal powders to the concaves and accumulating metal powders on the peripheral surface of the pattern roller except the concaves; and rolling directly the metal powders accumulated on the peripheral surface of the pattern roller by rotating a pair of the rollers. It is preferable to laminate porous metal sheets or solid metal sheets manufactured by a method other than the above-described method on the metal sheet manufactured by the above-described method.

李卫杰, 杨谦, 杨进 "Horizontal continuous annealing furnace for annealing titanium strips and steel strips" CN203569154U (Original Assignee: 中冶南方(武汉) 威仕工业炉 有限公司; Priority date: 2013-11-08). The utility model relates to a horizontal continuous annealing furnace for annealing titanium strips and steel strips. The horizontal continuous annealing furnace comprises a heating section, a transition section and a cooling section, wherein sealing systems are respectively arranged before the heating section and after the cooling section, and a protective atmosphere in all sections of the furnace is communicated; The horizontal continuous annealing furnace can be used for continuous annealing of the titanium strips and the steel strips so as to obtain the annealed titanium strips and the steel strips with uniform structures and performances and good surface quality.

Teruhisa Nakamura "Seal assembly for thermal treatment furnaces using an atmospheric gas containing hydrogen gas" U.S. Pat. No. 5,693,288A (Current Assignee: Nisshin Steel Co Ltd; Priority date: 1994-06-24). A seal assembly located at an entrance or exit of a heat treatment furnace for heat treating a continuously fed metallic strip using an atmospheric gas containing hydrogen gas as a furnace gas and including an elastic rotating roll which is engaged with an elastic pad fixed on a surface of a seal plate and the metallic strip to seal an inside of the furnace against outside air, wherein elastic members are provided in through-holes formed through a side plate of a furnace wall at positions corresponding to both side edges of the elastic pad and elastic member-moving mechanisms are provided for engaging the elastic members with the sides of the elastic pad.

Rüdiger Dr.-Ing. Conrad "Process for annealing metallic work pieces in a continuous furnace" EP0311030A1 (Current Assignee: Linde AG Original; Priority date 1987-10-07). Annealing processes in which blanketing gas atmospheres are used which contain nitrogen and hydrogen, are known, for example cracked ammonia gas. During annealing in continuous furnaces, so-called white dust forms, which precipitates in the cooling zone and especially in the heat exchangers arranged therein, which causes the entire continuous annealing furnace to be closed down. The formation of white dust is considerably reduced by using pure hydrogen as the blanketing gas in annealing.

The invention claimed is:

1. A continuous production reactor system for conversion of a solid green part to a solid product part in entirety comprising:
   an inlet gas exchange chamber configured to receive the solid green part and remove entrained oxygen or air;
   a tunnel furnace connected to the inlet gas exchange chamber by a gas-tight connector, and comprising:
      a preheating section comprising a plurality of heating zones and configured to gradually heat the solid green part to a temperature in a range from 200° C. to 450° C., and including an exhaust outlet for removing volatile or thermally-unstable constituents in the solid green part;
      a reaction and sintering section having an aspect ratio of length to width or diameter greater than 2 and comprising a plurality of heating zones and configured to heat the solid green part to a temperature in a range from 500° C. to 1300° C. so that the solid green part is converted to the solid product part; and
      a cooling section comprising a plurality of cooling zones and configured to gradually cool the solid product part;
   an outlet gas exchange chamber connected to the cooling section of the tunnel furnace by a gas-tight connector, and configured to receive the solid product part from the cooling section, and supplied with an inert gas for removing entrained reactive gas from the solid product part; and
   a reactant gas inlet located in the gas-tight connector between the cooling section and the outlet gas exchange chamber, the reactant gas inlet is configured to continuously provide a gas stream to react with the solid green part in the reaction and sintering section to form the solid product part;
   wherein the reacted gas is continuously removed via the exhaust port in the preheating section, and
   wherein the inlet gas exchange chamber, preheating section, reaction and sintering section, cooling section, and outlet gas exchange chamber are connected and are configured to feed the solid green part into the inlet gas exchange chamber and withdraw the solid product part out of the outlet gas exchange chamber at a controllable rate, and wherein the solid green part has a characteristic diffusion mass transfer dimension less than 1 mm and the solid product comprises metal-based microporous structures with pore sizes in a range of 0.3 nm to 5 µm and porosity no greater than about 67% without cracks, breakage or deformation.

2. The continuous production reactor system of claim 1, wherein the solid green part and gas stream are configured to move counter-currently in the reaction and sintering section.

3. The continuous production reactor system of claim 1, wherein the plurality of heating zones in the preheating section comprises a first number of heating zones and the plurality of heating zones in the reaction and sintering section comprises a second number of heating zones less than the first number of heating zones.

4. The continuous production reactor system of claim 1, wherein the gas stream contains hydrogen gas.

5. The continuous production reactor system of claim 1, wherein the reaction and sintering section has a maximum temperature of about 750° C. to about 1100° C.

6. The continuous production reactor system of claim 1, wherein the preheating section has a maximum temperature of about 300° C. to about 450° C.

7. The continuous production reactor system of claim 1, wherein the solid green part comprises a sheet having a thickness in a range from 25 µm to 1000 µm, and comprising nickel oxide, carbon pore former, and polymeric additives.

8. The continuous production reactor system of claim 1, wherein the solid green part comprises a sheet having a width in a range from 10 cm to 50 cm and a length in a range from 10 cm to 50 cm, and comprising nickel oxide, carbon pore former, and polymeric additives.

9. The continuous production reactor system of claim 1, wherein a length of the reaction and sintering section in the part-moving direction of the solid green part is greater than 210 cm.

10. The continuous production reactor system of claim 1, wherein a combined length of the preheating section and the reaction and sintering section in the part-moving direction of the solid green part is greater than 525 cm.

11. The continuous production reactor system of claim 1, wherein a length of the preheating section in the part-moving direction of the solid green part is greater than a length of the reaction and sintering section in the part-moving direction.

12. The continuous production reactor system of claim 1, wherein the tunnel furnace includes a plurality of independently-controlled electrical heaters for heating the tunnel furnace.

13. The continuous production reactor system of claim 12, wherein the plurality of independently-controlled electrical heaters are configured so that the preheating section comprises a first rate of change of temperature along the part moving direction, the reaction and sintering section comprises a second rate of change of temperature along the part moving direction that is greater than the first rate of change of temperature, and the cooling section comprises a third rate of change of temperature along the part moving direction that is greater than the second rate of change of temperature.

14. The continuous production reactor system of claim 1, wherein the discharge port is located in the preheating section so that the gas stream flows from the reactant gas inlet to the discharge port in a direction counter to the part-moving direction of the solid green part.

15. A continuous system for converting a solid green part into a porous structure, the continuous system comprising:
- an inlet gas exchange chamber that is supplied with an inert gas;
- a tunnel furnace connected to the inlet gas exchange chamber and comprising:
  - a preheating section comprising a first plurality of heating zones and configured to gradually heat the solid green part to a first temperature in a first range from 200° C. to 450° C.;
  - a reaction and sintering section having an aspect ratio of length to width or diameter of greater than 2 and comprising a second plurality of heating zones and configured to heat the solid green part to a second temperature in a second range from 500° C. to 1300° C. so that the solid green part is converted to the solid product part; and
  - a cooling section comprising a plurality of cooling zones and configured to gradually cool the solid product part;
- a reactant gas inlet located in the gas-tight connector between the cooling section and the outlet gas exchange chamber, the reactant gas inlet continuously supplies the reaction and sintering section with a reactant gas for reducing a metal precursor in the solid green part to metallic grains;
- an exhaust port that continuously exhausts reacted gas from at least one of the preheating section, the reaction and sintering section, and the cooling section; and
- an outlet gas exchange chamber connected to the cooling section of the tunnel furnace by a gas-tight connector and configured to receive the solid product part from the cooling section, and supplied with an inert gas for removing entrained reactive gas from the solid product part,
- wherein the solid green part has a characteristic diffusion mass transfer dimension less than 1 mm and the porous structure comprises metal-based micro-porous structures with pore sizes in a range of 0.3 nm to 5 μm and porosity no greater than about 67% without cracks, breakage or deformation.

16. The continuous system of claim 15, wherein the reactant gas inlet continuously supplies the reactant gas to the reaction and sintering section in a gas stream that flows in a direction that is opposite the part moving direction.

17. The continuous system of claim 15, wherein the reactant gas comprises pure hydrogen gas.

18. The continuous system of claim 15, wherein the inert gas supplied to the inlet gas exchange chamber removes oxygen from the inlet gas exchange chamber.

19. The continuous system of claim 15, wherein the preheating section, the reaction section, and the cooling section of the tunnel furnace are in one reactor body.

* * * * *